United States Patent
Lai

(10) Patent No.: US 11,373,904 B2
(45) Date of Patent: Jun. 28, 2022

(54) MANUFACTURING METHOD OF SEMICONDUCTOR DEVICE

(71) Applicant: Powerchip Semiconductor Manufacturing Corporation, Hsinchu (TW)

(72) Inventor: Chun-Chi Lai, Hsinchu (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 202 days.

(21) Appl. No.: 16/921,946

(22) Filed: Jul. 7, 2020

(65) Prior Publication Data

US 2021/0366769 A1 Nov. 25, 2021

(30) Foreign Application Priority Data

May 19, 2020 (TW) .................................. 109116486

(51) Int. Cl.
*H01L 21/768* (2006.01)
(52) U.S. Cl.
CPC .. *H01L 21/76892* (2013.01); *H01L 21/76828* (2013.01); *H01L 21/76834* (2013.01); *H01L 21/76895* (2013.01)
(58) Field of Classification Search
CPC ......... H01L 21/76892; H01L 21/76838; H01L 21/76828; H01L 21/76834; H01L 21/76895; H01L 23/485; H01L 21/76883; H01L 23/5329; H01L 21/76822
See application file for complete search history.

(56) References Cited

U.S. PATENT DOCUMENTS

2005/0017295 A1  1/2005  Kim et al.
2019/0043870 A1*  2/2019  Lin ................... H01L 21/76802

FOREIGN PATENT DOCUMENTS

TW  200725749  7/2007
TW  201403677  1/2014
TW  201911388  3/2019
TW  I691024  4/2020

OTHER PUBLICATIONS

"Office Action of Taiwan Counterpart Application", dated Nov. 30, 2020, p. 1-p. 7.

* cited by examiner

*Primary Examiner* — Thanhha S Pham
(74) *Attorney, Agent, or Firm* — JCIPRNET

(57) ABSTRACT

A manufacturing method of a semiconductor device is provided. A substrate is provided. The substrate has an active area. A plurality of word lines are formed on the substrate. Each of the word lines is extended along a first direction, and the word lines are arranged on both sides of the active area along a second direction. A first dielectric layer is formed on the substrate. The first dielectric layer covers the active area and the word lines. A contact is formed on the active area. The contact penetrates through the first dielectric layer and is electrically connected to the active area. A heating process is performed on the first dielectric layer to shrink the first dielectric layer inward, and the contact is correspondingly expanded outward.

20 Claims, 6 Drawing Sheets

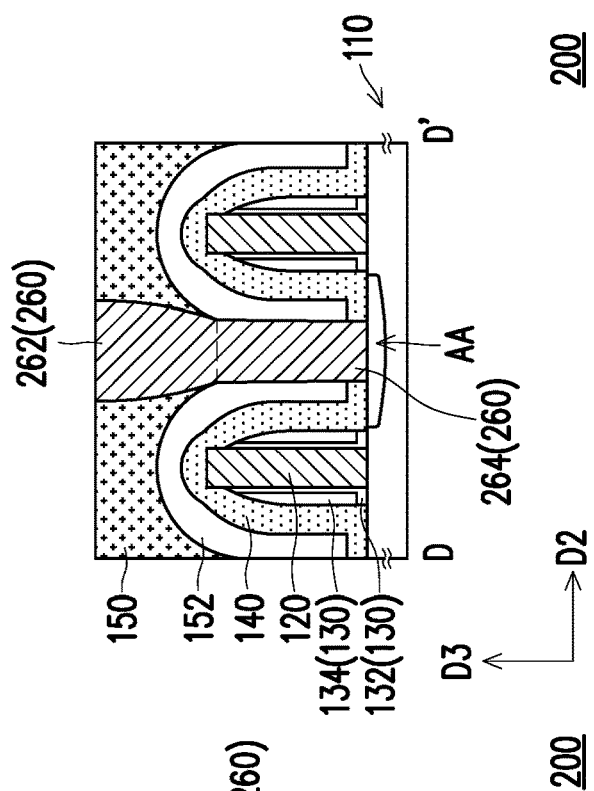
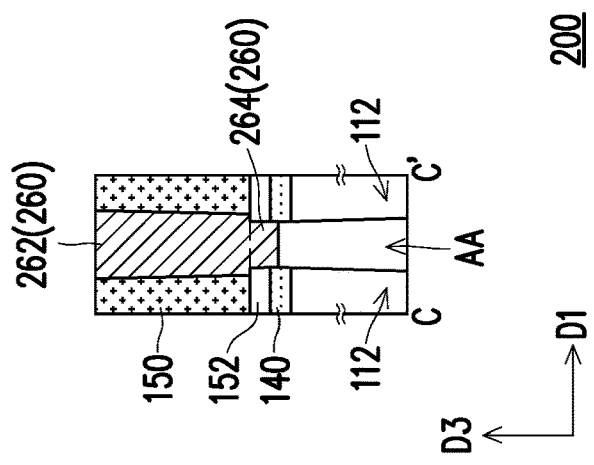
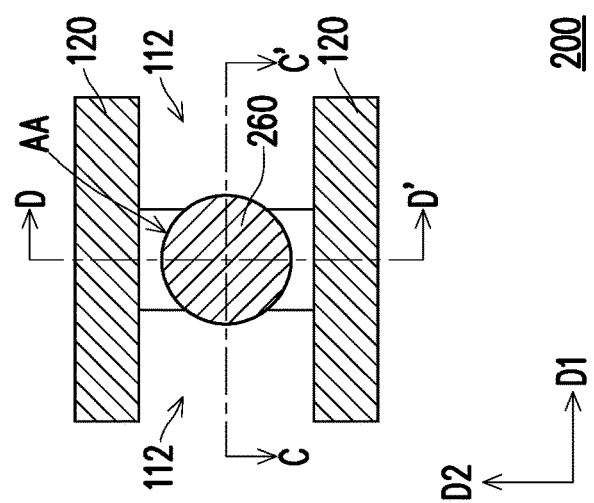

MANUFACTURING METHOD OF SEMICONDUCTOR DEVICE

CROSS-REFERENCE TO RELATED APPLICATION

This application claims the priority benefit of Taiwan application serial no. 109116486, filed on May 19, 2020. The entirety of the above-mentioned patent application is hereby incorporated by reference herein and made a part of this specification.

BACKGROUND OF THE INVENTION

Field of the Invention

The invention relates to a semiconductor device technique, and particularly to a manufacturing method of a semiconductor device.

Description of Related Art

In semiconductor devices (such as memory devices), the size of the contact often directly affects the performance of the semiconductor device. For example, when the size of the contact is smaller, a higher contact resistance value is generated, thus reducing the performance of the semiconductor device. Therefore, how to effectively increase the size of the contact in the semiconductor device to reduce contact resistance value so as to improve the performance of the semiconductor device is a very important subject.

SUMMARY OF THE INVENTION

The invention provides a manufacturing method of a semiconductor device that may effectively increase the size of a contact in the semiconductor device to reduce the resistance value of the contact, and thus may improve the efficiency of the semiconductor device.

The invention provides a manufacturing method of a semiconductor device including at least the following steps. A substrate is provided. The substrate has an active area. A plurality of word lines are formed on the substrate. Each of the word lines is extended along a first direction, and the word lines are arranged on both sides of the active area along a second direction. A first dielectric layer is formed on the substrate. The first dielectric layer covers the active area and the word lines. A contact is formed on the active area. The contact penetrates through the first dielectric layer and is electrically connected to the active area. A heating process is performed on the first dielectric layer to shrink the first dielectric layer inward, and the contact is correspondingly expanded outward.

In an embodiment of the invention, a portion of the contact surrounded by the first dielectric layer is correspondingly expanded outward after the heating process is performed.

In an embodiment of the invention, a size of the contact is increased after the heating process is performed.

In an embodiment of the invention, the contact does not cover sidewalls of the active area in the first direction after the heating process is performed.

In an embodiment of the invention, a shrinkage ratio of the first dielectric layer is between 5% and 25%.

In an embodiment of the invention, a material of the first dielectric layer includes spin-on glass, high aspect ratio process silicon oxide, flowable chemical vapor deposition silicon oxide, or a combination thereof.

In an embodiment of the invention, the manufacturing method of the semiconductor device further includes forming a plurality of isolation structures in the substrate. The plurality of isolation structures are arranged on both sides of the active area along the first direction, and an orthographic projection of the contact on the substrate is overlapped with the plurality of isolation structures after the heating process is performed.

In an embodiment of the invention, the manufacturing method of the semiconductor device further includes forming a second dielectric layer on the substrate. The second dielectric layer covers the plurality of word lines.

In an embodiment of the invention, the second dielectric layer is sandwiched between the substrate and the first dielectric layer in a third direction.

In an embodiment of the invention, a portion of the contact is located at a top surface of the second dielectric layer after the heating process is performed.

In an embodiment of the invention, the contact is funnel-shaped after the heating process is performed.

In an embodiment of the invention, the contact has discontinuous sidewalls.

In an embodiment of the invention, the contact includes a first portion and a second portion, the second portion is located between the first portion and the active area, and after the heating process is performed, the first portion is correspondingly expanded outward, and the second portion is not expanded.

In an embodiment of the invention, the first portion is a portion of the contact surrounded by the first dielectric layer, and the second portion is a portion of the contact surrounded by the second electric layer.

In an embodiment of the invention, the step of forming the contact includes removing a portion of the first dielectric layer and the second dielectric layer to form an opening exposing a portion of the active area. The opening is filled with a conductive material. A planarization process is performed on the conductive material.

In an embodiment of the invention, a material of the second dielectric layer is different from a material of the first dielectric layer.

In an embodiment of the invention, a shrinkage ratio of the second dielectric layer is between 0% and 2%.

In an embodiment of the invention, the material of the second dielectric layer includes high-density plasma chemical vapor deposition silicon oxide, plasma-enhanced chemical vapor deposition tetraethoxysilane oxide, low-pressure chemical vapor deposition tetraethoxysilane oxide, or a combination thereof.

In an embodiment of the invention, the second dielectric layer is conformally formed on the plurality of word lines.

In an embodiment of the invention, before the heating process is performed, a portion of the contact is in direct contact with the second dielectric layer.

Based on the above, according to the physical properties of the material of the first dielectric layer, in the invention, the first dielectric layer may be shrunk inward after the heating process is performed, and the first portion of the contact is correspondingly expanded outward to effectively increase the size of the contact in the semiconductor device to reduce the resistance value of the contact, thereby improving the performance of the semiconductor device.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 4A, FIG. 5A, and FIG. 6A are top views of a manufacturing method of a semiconductor device according to another embodiment of the invention.

FIG. 4B, FIG. 5B, and FIG. 6B are cross-sectional views along line C-C' of FIG. 4A, FIG. 5A, and FIG. 6A.

FIG. 4C, FIG. 5C, and FIG. 6C are cross-sectional views along line D-D' of FIG. 4A, FIG. 5A, and FIG. 6A.

DESCRIPTION OF THE EMBODIMENTS

Figure 1A:
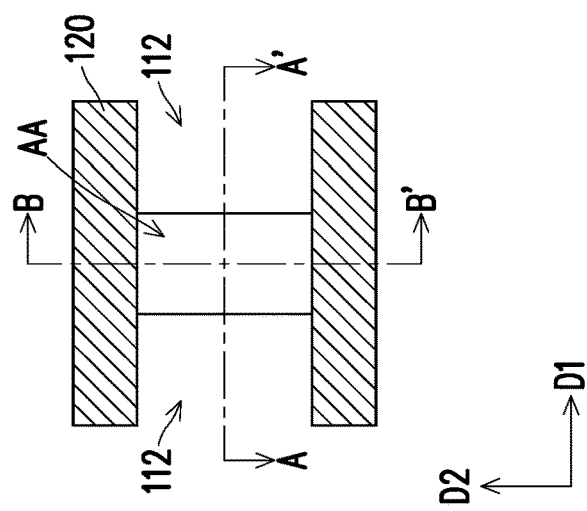
FIG. 1A, FIG. 2A, and FIG. 3A are top views of a manufacturing method of a semiconductor device according to an embodiment of the invention.
Figure 1B:
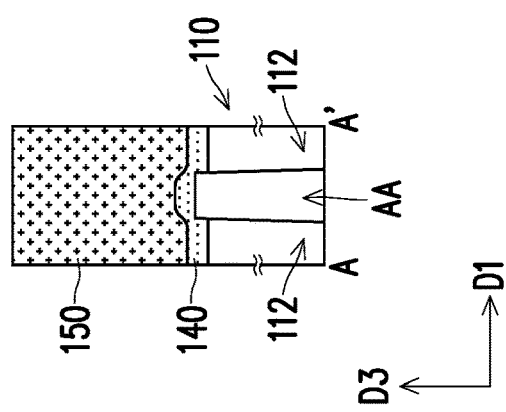
FIG. 1B, FIG. 2B, and FIG. 3B are cross-sectional views along line A-A' of FIG. 1A, FIG. 2A, and FIG. 3A.
Figure 1C:
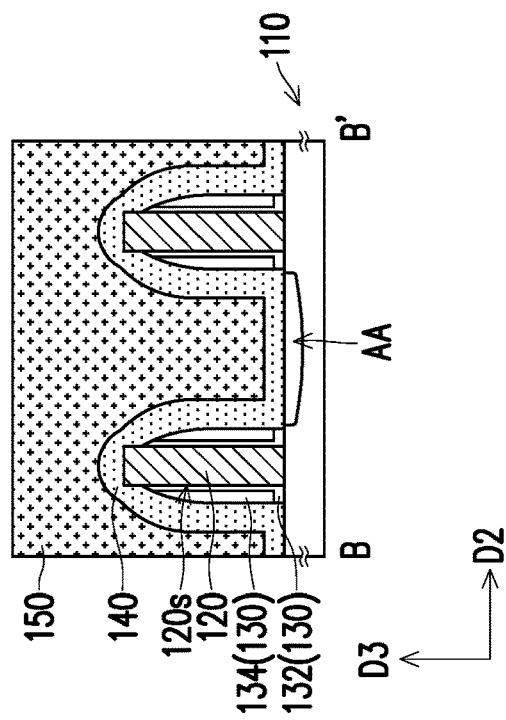
FIG. 1C, FIG. 2C, and FIG. 3C are cross-sectional views along line B-B' of FIG. 1A, FIG. 2A, and FIG. 3A.
Figure 2C:
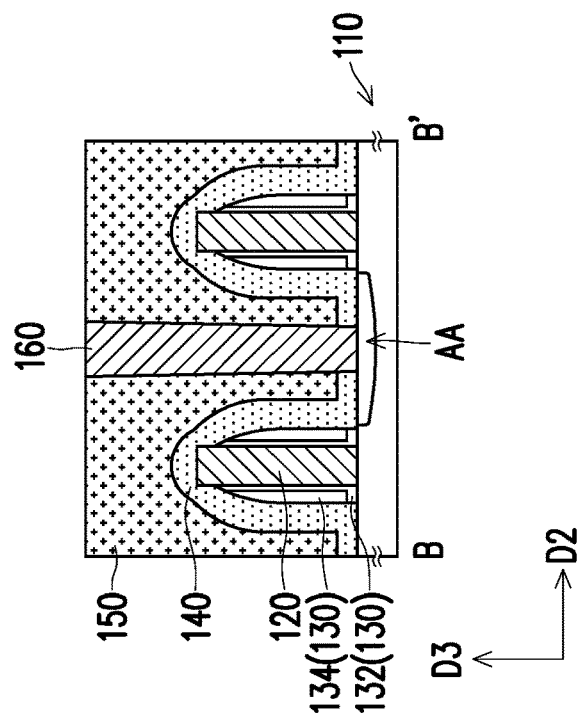
Figure 2B:
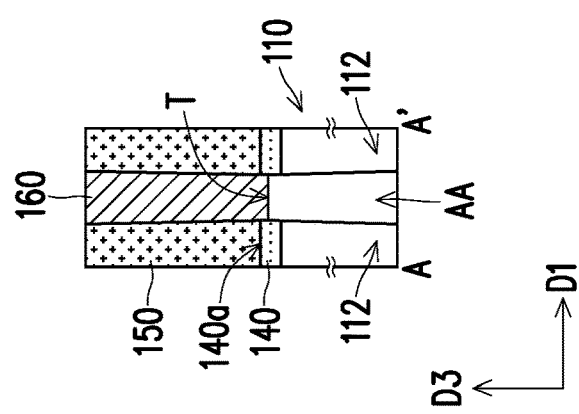
Figure 2A:
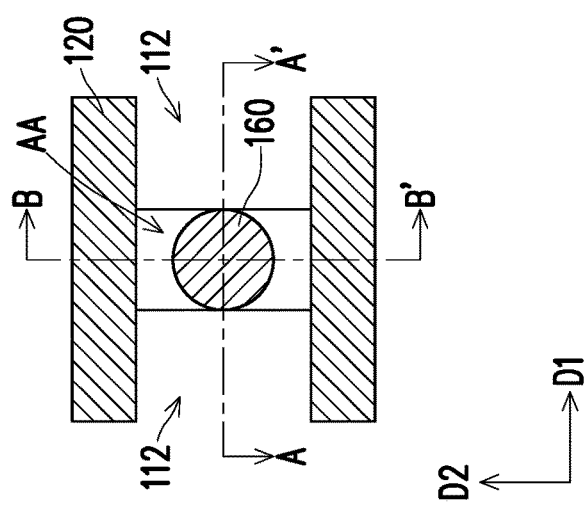
Figure 3C:
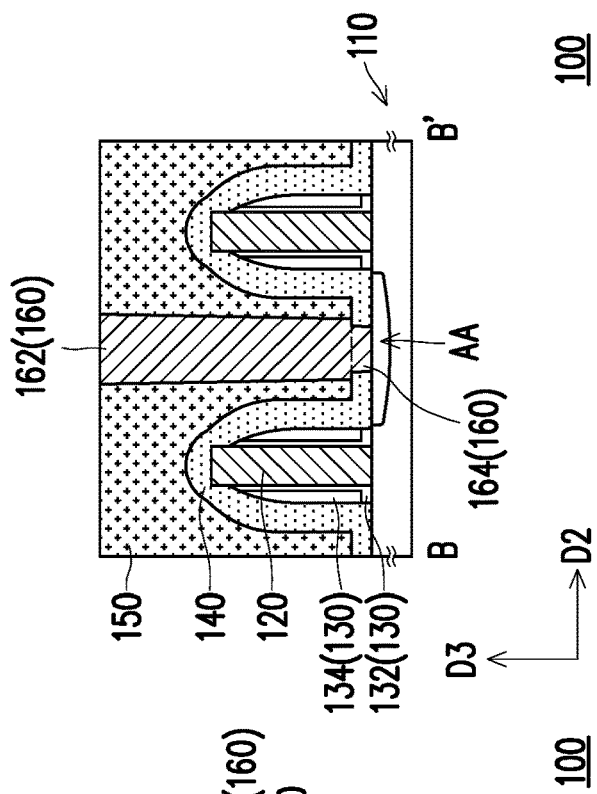
Figure 3B:
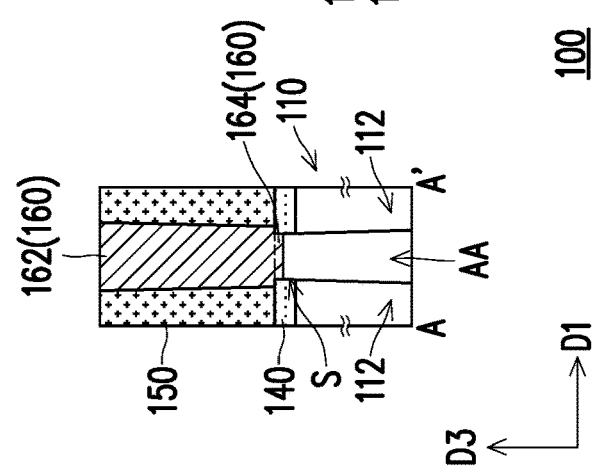
Figure 3A:
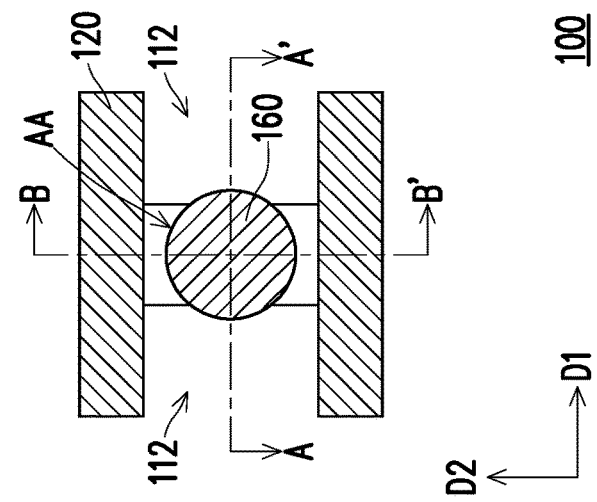

FIG. 1A, FIG. 2A, and FIG. 3A are top views of a manufacturing method of a semiconductor device according to an embodiment of the invention. FIG. 1B, FIG. 2B, and FIG. 3B are cross-sectional views along line A-A' of FIG. 1A, FIG. 2A, and FIG. 3A. FIG. 1C, FIG. 2C, and FIG. 3C are cross-sectional views along line B-B' of FIG. 1A, FIG. 2A, and FIG. 3A.

Referring to all of FIG. 1A to FIG. 1C, a substrate 110 is provided. The substrate 110 may be a semiconductor substrate. For example, the substrate 110 is a silicon substrate. Next, a plurality of isolation structures 112 may be formed in the substrate 110 to define an active area AA on the substrate 110, wherein the plurality of isolation structures 112 may be arranged on both sides of the active area AA along a first direction D1. In an embodiment, the isolation structures 112 may be shallow trench isolation (STI) structures.

Moreover, a plurality of word lines 120 may be formed on the substrate 110, wherein each of the word lines 120 may be extended along the first direction D1, and the plurality of word lines 120 may be arranged on both sides of the active area AA along a second direction D2. Here, the second direction D2 and the first direction D1 may be perpendicular to each other, but the invention is not limited thereto. In an embodiment, the forming method of the word lines 120 may include forming a doped polysilicon layer (not shown) on the substrate 110, and then performing a patterning step of lithography and etching on the doped polysilicon layer, but the invention is not limited thereto. Depending on actual design requirements, the word lines 120 may also be formed by other suitable methods and materials.

In the present embodiment, as shown in FIG. 1C, spacers 130 covering sidewalls 120s of the word lines 120 may be formed on both sides of the word lines 120. The spacers 130 are formed by, for example, a silicon oxide layer, a silicon nitride layer, or a combination thereof. For example, the spacers 130 may include a first spacer 132 and a second spacer 134 formed on the first spacer 132, wherein the first spacer 132 may be a silicon oxide layer, the second spacer 134 may be a silicon nitride layer, or the first spacer 132 may be a silicon nitride layer, and the second spacer 134 may be a silicon oxide layer. However, the invention is not limited thereto, and the number of layers, the material, and the arrangement of the spacers 130 may be determined according to actual design requirements. The forming method of the spacers 130 is, for example, chemical vapor deposition (CVD).

In addition, different films may be optionally formed on the substrate 110 in correspondence to the forming method of a subsequent contact opening (not shown). For example, when a contact opening is subsequently formed using an etching process, an etch stop layer 140 may be optionally formed on the substrate 110 to cover the plurality of word lines 120 and the active area AA. In an embodiment, the etch stop layer 140 may be conformally formed on the plurality of word lines 120 and the active area AA, and the etch stop layer 140 may cover the isolation structures 112, but the invention is not limited thereto. In an embodiment, the material of the etch stop layer 140 may have the physical property of not shrinking inward when substantially heated. For example, the material of the etch stop layer 140 is silicon nitride, but the invention is not limited thereto.

Then, a dielectric layer 150 may be formed on the substrate 110. The dielectric layer 150 covers the plurality of word lines 120 and the active area AA. In the present embodiment, the dielectric layer 150 may cover the etch stop layer 140. In other words, the etch stop layer 140 may be sandwiched between the dielectric layer 150 and the substrate 110. Further, in a third direction D3, the etch stop layer 140 and the dielectric layer 150 may be sequentially stacked on the substrate 110. Here, the third direction D3 may respectively be perpendicular to the first direction D1 and the second direction D2, but the invention is not limited thereto.

In the present embodiment, the material of the etch stop layer 140 and the material of the dielectric layer 150 may be different. The material of the dielectric layer 150 may have the physical property of shrinking inward when heated, such as shrinkage oxide. The forming method of the dielectric layer 150 may be a spin-on dielectric (SOD) process. Further, the shrinkage ratio of the dielectric layer 150 is, for example, between 5% and 25%, and when the shrinkage ratio of the dielectric layer 150 is, for example, between 10% and 20%, better shrinkage effect may be achieved, but the invention is not limited thereto. For example, the material of the dielectric layer 150 is a spin-on dielectric layer (SOD) or an oxide layer, such as spin-on glass (SOG), high aspect ratio process (HARP) silicon oxide, flowable chemical vapor deposition silicon oxide (flowable CVD oxide), or a combination thereof. It should be noted that the material of the dielectric layer 150 may be selected according to actual design requirements, and any material of the dielectric layer 150 having the physical property of shrinking inward when heated is within the scope of the invention.

Referring to all of FIG. 2A to FIG. 2C, a contact 160 is formed on the active area AA. The contact 160 penetrates through the dielectric layer 150 and is electrically connected to the active area AA. The forming method of the contact 160 is, for example, removing a portion of the dielectric layer 150 and the etch stop layer 140 to form an opening (not shown) exposing a portion of the active area AA, and then filling the opening with a conductive material, and then a planarization process (for example, a chemical mechanical polishing process or an etch-back process) is performed on the conductive material. The method of removing a portion of the dielectric layer 150 and the etch stop layer 140 is, for example, an etching process.

The forming method of the conductive material is, for example, physical vapor deposition (PVD) or chemical vapor deposition. The conductive material is, for example, tungsten. In an embodiment not shown, a diffusion barrier layer may be formed in the opening before the conductive material is formed, wherein the material of the diffusion barrier layer may be titanium, titanium nitride, or a combination thereof, but the invention is not limited thereto.

In the present embodiment, as shown in FIG. 2B, in the first direction D1, a top surface 140a of the remaining etch stop layer 140 may be higher than a top surface T of the active area AA, but the invention is not limited thereto.

Referring to all of FIG. 3A to FIG. 3C, the dielectric layer 150 is subjected to a heating process so that the dielectric layer 150 is shrunk inward and the contact 160 is correspondingly expanded outward. The orthographic projection of the contact 160 on the substrate 110 may be overlapped with the plurality of isolation structures 112, but the invention is not limited thereto. Due to the physical properties of the material of the dielectric layer 150, the dielectric layer 150 may be shrunk inward after the heating process is performed, and the contact 160 is expanded correspondingly outward, so as to effectively increase the size of the contact 160 in the semiconductor device 100 to reduce the resistance value of the contact 160 and to further improve the performance of the semiconductor device 100.

Further, after the heating process is performed, the size of the contact 160 is increased. For example, as shown in FIG. 2B to FIG. 2C and FIG. 3B to FIG. 3C, the portion of the contact 160 surrounded by the dielectric layer 150 is correspondingly expanded outward after the heating process is performed, so that the size of the contact 160 after the heating process is performed may be larger than the size of the contact 160 before the heating process is performed.

In the present embodiment, in addition to effectively increasing the size of the contact 160 in the semiconductor device 100, after the heating process is performed, the contact 160 may not cover sidewalls S of the active area in the first direction D1. Therefore, in the invention, the issue of electrical failure of the device in the first direction D1 may be avoided while the performance of the semiconductor device 100 is improved. For example, when an opening of a desired size is formed on the active area by an etching process in the first direction D1, the issue of electrical failure of the device readily occurs due to punching of the dielectric layer and etching to both sides of the active area.

According to the physical properties of the material of the dielectric layer 150, the first dielectric layer 150 may be shrunk inward after the heating process is performed, and the contact 160 is correspondingly expanded outward to overcome the limitation of the semiconductor device 100 by the size of the active area AA in the first direction D1 while the performance of the semiconductor device 100 is improved.

In the present embodiment, after the heating process is performed, in the third direction D3, a portion of the etch stop layer 140 may be sandwiched between the active area AA and the contact 160. In other words, a portion of the contact 160 may be located at the top surface of the etch stop layer 140 after the heating process is performed. The contact 160 may be funnel-shaped. The contact 160 may have discontinuous sidewalls. In other words, the contact 160 may have a plurality of sidewalls on the same side, and there may be turning points between the plurality of sidewalls.

Further, as shown in FIG. 3B and FIG. 3C, the contact 160 may include a first portion 162 and a second portion 164, wherein the second portion 164 is located between the first portion 162 and the active area AA, and after the heating process is performed, the first portion 162 is correspondingly expanded outward, and the second portion 164 is not expanded. Here, the first portion 162 is a portion of the contact 160 surrounded by the dielectric layer 150, and the second portion 164 is a portion of the contact 160 surrounded by the etch stop layer 140.

Since the material of the etch stop layer 140 and the material of the dielectric layer 150 may have different physical properties, for example, the material of the etch stop layer 140 may have the physical property of not shrinking inward when substantially heated, and the material of the dielectric layer 150 may have the physical property of shrinking inward when heated, so that the first portion 162 surrounded by the dielectric layer 150 is correspondingly expanded outward, and the second portion 164 surrounded by the etch stop layer 140 is not expanded. Therefore, the size of the contact 160 is related to the position of the remaining etch-stop layer 140. In other words, the size of the first portion 162 of the contact 160 may be defined by the dielectric layer 150, and the size of the second portion 164 of the contact 160 may be defined by the etch stop layer 140, that is, substantially equal to the size of the opening before the heating process is performed.

After the above process, the manufacture of the semiconductor device 100 of the present embodiment is substantially completed. It should be noted that in FIG. 1A, FIG. 2A, and FIG. 3A, for the sake of clarity, only the isolation structures 112, the active area AA, the word lines 120, and the contact 160 are shown, and the spacers 130, the etch stop layer 140, and the dielectric layer 150 and other films are omitted.

It must be noted here that the following embodiments follow the reference numerals and a portion of the contents of the above embodiments, wherein the same or similar reference numerals are used to indicate the same or similar devices, and description of the same technical content is omitted. For the description of the omitted portions, reference may be made to the above embodiments, which is not repeated in the following embodiments.

Figure 4C:
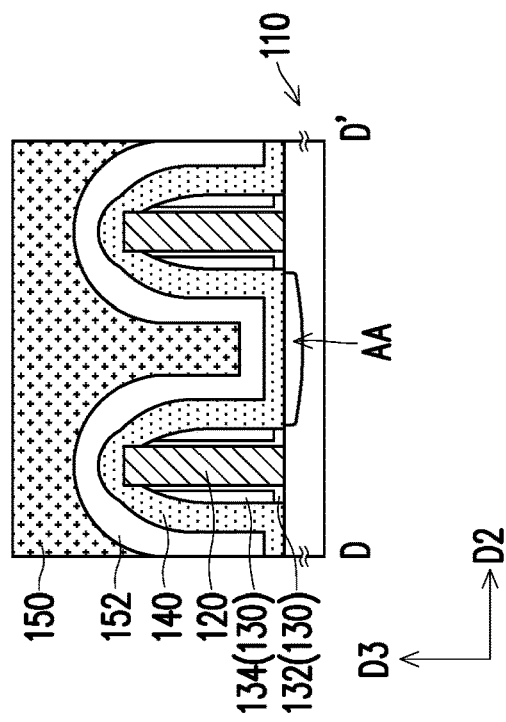
Figure 4B:
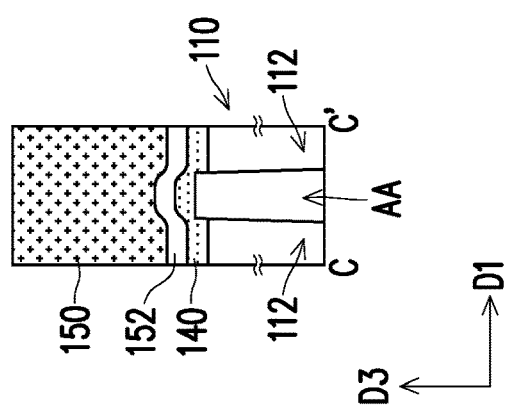
Figure 4A:
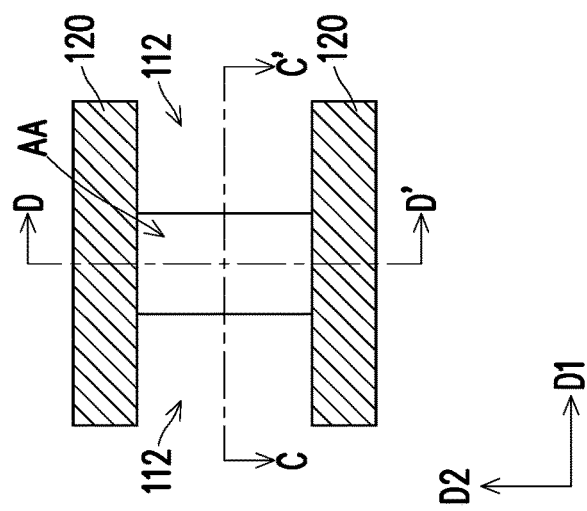
Figure 5C:
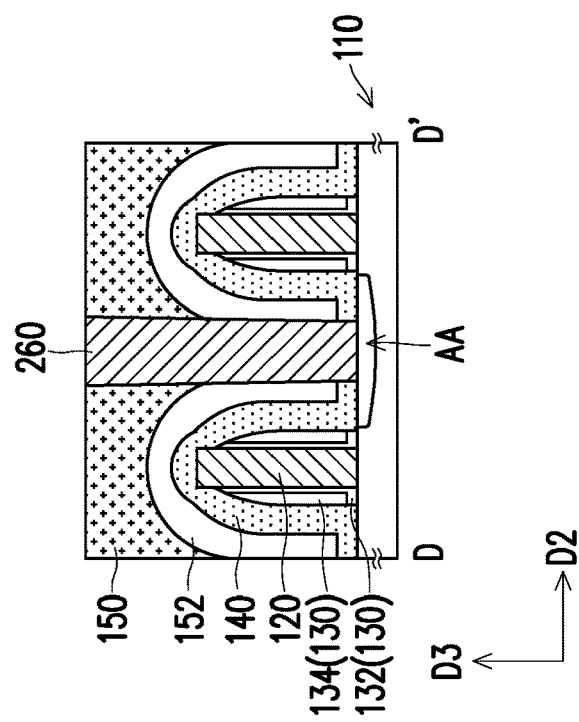
Figure 5B:
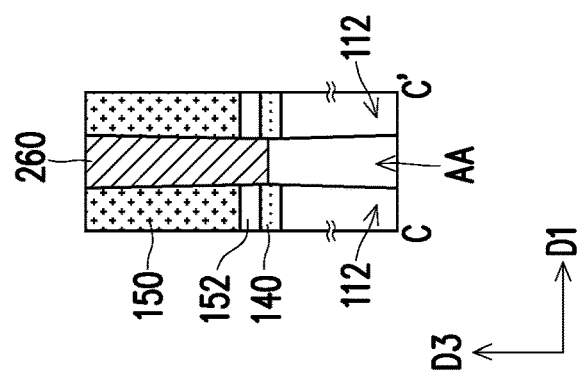
Figure 5A:
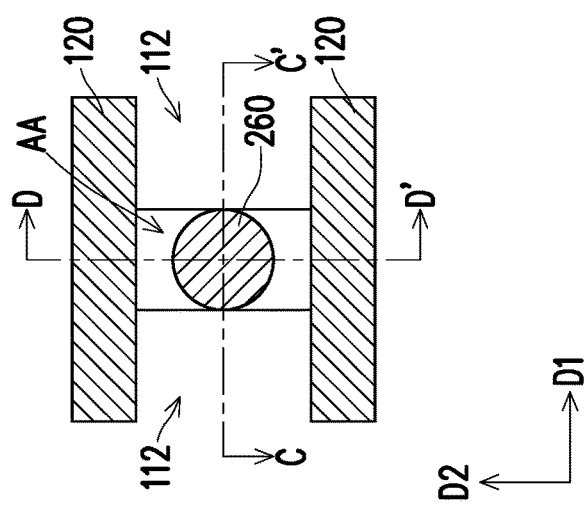

FIG. 4A, FIG. 5A, and FIG. 6A are top views of a manufacturing method of a semiconductor device according to another embodiment of the invention. FIG. 4B, FIG. 5B, and FIG. 6B are cross-sectional views along line C-C' of FIG. 4A, FIG. 5A, and FIG. 6A. FIG. 4C, FIG. 5C, and FIG. 6C are cross-sectional views along line D-D' of FIG. 4A, FIG. 5A, and FIG. 6A.

Referring to FIG. 4A to FIG. 6C at the same time, compared to the semiconductor device 100 of the previous embodiment, a semiconductor device 200 of the present embodiment further includes a dielectric layer 152 formed on the substrate 110, wherein the dielectric layer 152 may cover the plurality of word lines 120, and the dielectric layer 152 is conformally formed on the plurality of word lines 120, for example. In addition, the step of forming a contact 260 may further include removing a portion of the dielectric layer 150 and the dielectric layer 152 to form an opening exposing a portion of the active area AA.

Further, in the third direction, the dielectric layer 152 may be sandwiched between the substrate 110 and the dielectric layer 150. In addition, before the heating process is performed, a portion of the contact 260 and the dielectric layer 152 may be in direct contact, and after the heating process is performed, a portion of the contact 260 may be located at the top surface of the dielectric layer 152. Moreover, the first portion 262 of the contact 260 may be surrounded by the dielectric layer 150, and the second portion 264 of the contact 260 may be surrounded by the dielectric layer 152.

When the distance between the word lines 120 is smaller in the second direction D2, in the present embodiment, the configuration of the dielectric layer 152 may reduce the probability of adverse effects on electrical properties due to the contact 260 being too close to the word lines 120 in the second direction D2. Therefore, via the configuration of the dielectric layer 152, in the invention, the limitation of the distance between the word lines 120 in the second direction D2 may be further overcome.

In the present embodiment, the material of the dielectric layer 152 may be different from the dielectric layer 150. For example, the material of the dielectric layer 152 may have the physical property of not shrinking inward when substantially heated, and the shrinkage ratio thereof is, for example, between 0% and 2%. In addition, the material of the dielectric layer 152 is different from the material of the etch stop layer, for example. The material of the dielectric layer 152 is, for example, oxide, such as high-density plasma chemical vapor deposition silicon oxide, plasma-enhanced chemical vapor deposition tetraethoxysilane oxide (PECVD TEOS oxide), low-pressure chemical vapor deposition tetraethoxysilane oxide, or a combination thereof. However, the invention is not limited thereto. The material of the dielectric layer 152 may be determined according to actual design requirements, and any material of the dielectric layer 152 having the physical property of not shrinking inward when substantially heated is within the scope of the invention.

It should be noted that the dielectric layer 150 may be a first dielectric layer, and the dielectric layer 152 may be a second dielectric layer. In addition, as shown in FIG. 3B and FIG. 3C and FIG. 6B and FIG. 6C, due to the different degrees of coverage of the sidewalls of the contact by the dielectric layer, there may be a height difference for the first portion/second portion in the cross section in different directions.

Based on the above, according to the physical properties of the material of the first dielectric layer, in the invention, the first dielectric layer may be shrunk inward after the heating process is performed, and the first portion of the contact is correspondingly expanded outward to effectively increase the size of the contact in the semiconductor device to reduce the resistance value of the contact, thereby improving the performance of the semiconductor device. Furthermore, the limitation of the size of the active area of the semiconductor device in the first direction may be overcome while the performance of the semiconductor device is improved. In addition, the configuration of the second dielectric layer may further reduce the probability of adverse effects on electrical properties due to the contact being too close to the word lines in the second direction when the distance between the word lines is smaller, so as to further overcome the limitation of the distance between the word lines in the second direction.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A manufacturing method of a semiconductor device, comprising:
providing a substrate, wherein the substrate has an active area;
forming a plurality of word lines on the substrate, wherein each of the plurality of word lines is extended along a first direction, and the plurality of word lines are arranged on both sides of the active area along a second direction;
forming a first dielectric layer on the substrate, wherein the first dielectric layer covers the active area and the plurality of word lines;
forming a contact on the active area, wherein the contact penetrates through the first dielectric layer and is electrically connected to the active area; and
performing a heating process on the first dielectric layer to shrink the first dielectric layer inward, and the contact is correspondingly expanded outward.

2. The manufacturing method of the semiconductor device of claim 1, wherein a portion of the contact surrounded by the first dielectric layer is correspondingly expanded outward after the heating process is performed.

3. The manufacturing method of the semiconductor device of claim 1, wherein a size of the contact is increased after the heating process is performed.

4. The manufacturing method of the semiconductor device of claim 1, wherein the contact does not cover sidewalls of the active area in the first direction after the heating process is performed.

5. The manufacturing method of the semiconductor device of claim 1, wherein a shrinkage ratio of the first dielectric layer is between 5% and 25%.

6. The manufacturing method of the semiconductor device of claim 1, wherein a material of the first dielectric layer comprises spin-on glass, high aspect ratio process silicon oxide, flowable chemical vapor deposition silicon oxide, or a combination thereof.

7. The manufacturing method of the semiconductor device of claim 1, further comprising:
forming a plurality of isolation structures in the substrate, wherein the plurality of isolation structures are arranged on both sides of the active area along the first direction, and an orthographic projection of the contact on the substrate is overlapped with the plurality of isolation structures after the heating process is performed.

8. The manufacturing method of the semiconductor device of claim 1, further comprising:
forming a second dielectric layer on the substrate, wherein the second dielectric layer covers the plurality of word lines.

9. The manufacturing method of the semiconductor device of claim 8, wherein the second dielectric layer is sandwiched between the substrate and the first dielectric layer in a third direction.

10. The manufacturing method of the semiconductor device of claim 8, wherein a portion of the contact is located at a top surface of the second dielectric layer after the heating process is performed.

11. The manufacturing method of the semiconductor device of claim 8, wherein the contact is funnel-shaped after the heating process is performed.

12. The manufacturing method of the semiconductor device of claim 8, wherein the contact has discontinuous sidewalls.

13. The manufacturing method of the semiconductor device of claim 8, wherein the contact comprises a first portion and a second portion, the second portion is located between the first portion and the active area, and after the heating process is performed, the first portion is correspondingly expanded outward, and the second portion is not expanded.

14. The manufacturing method of the semiconductor device of claim 13, wherein the first portion is a portion of the contact surrounded by the first dielectric layer, and the second portion is a portion of the contact surrounded by the second electric layer.

15. The manufacturing method of the semiconductor device of claim 8, wherein forming the contact comprises:
   removing a portion of the first dielectric layer and the second dielectric layer to form an opening exposing a portion of the active area;
   filling the opening with a conductive material; and
   performing a planarization process on the conductive material.

16. The manufacturing method of the semiconductor device of claim 8, wherein a material of the second dielectric layer is different from a material of the first dielectric layer.

17. The manufacturing method of the semiconductor device of claim 16, wherein a shrinkage ratio of the second dielectric layer is between 0% and 2%.

18. The manufacturing method of the semiconductor device of claim 17, wherein the material of the second dielectric layer comprises high-density plasma chemical vapor deposition silicon oxide, plasma-enhanced chemical vapor deposition tetraethoxysilane oxide, low-pressure chemical vapor deposition tetraethoxysilane oxide, or a combination thereof.

19. The manufacturing method of the semiconductor device of claim 8, wherein the second dielectric layer is conformally formed on the plurality of word lines.

20. The manufacturing method of the semiconductor device of claim 19, wherein before the heating process is performed, a portion of the contact is in direct contact with the second dielectric layer.

* * * * *